US010312665B2

(12) United States Patent
Kitatani et al.

(10) Patent No.: US 10,312,665 B2
(45) Date of Patent: Jun. 4, 2019

(54) OPTICAL SEMICONDUCTOR DEVICE, OPTICAL SUBASSEMBLY, AND OPTICAL MODULE

(71) Applicant: Oclaro Japan, Inc., Kanagawa (JP)

(72) Inventors: Takeshi Kitatani, Tokyo (JP); Kaoru Okamoto, Kanagawa (JP); Kouji Nakahara, Tokyo (JP)

(73) Assignee: Oclaro Japan, Inc., Kanagawa (JP)

( * ) Notice: Subject to any disclaimer, the term of this patent is extended or adjusted under 35 U.S.C. 154(b) by 0 days.

(21) Appl. No.: 15/996,562

(22) Filed: Jun. 4, 2018

(65) Prior Publication Data

US 2018/0366909 A1    Dec. 20, 2018

(30) Foreign Application Priority Data

Jun. 14, 2017  (JP) ................. 2017-117176

(51) Int. Cl.
*H01S 5/00* (2006.01)
*H01S 5/32* (2006.01)
(Continued)

(52) U.S. Cl.
CPC ............ *H01S 5/3218* (2013.01); *H01S 5/026* (2013.01); *H01S 5/0208* (2013.01);
(Continued)

(58) Field of Classification Search
CPC ...... H01S 5/3054; H01S 5/0208; H01S 5/026; H01S 5/0425; H01S 5/22; H01S 5/3432;
(Continued)

(56) References Cited

U.S. PATENT DOCUMENTS 5,048,036 A * 9/1991 Scifres ............... B82Y 20/00
257/190
5,177,583 A * 1/1993 Endo ............... H01L 29/7378
257/190
(Continued)

FOREIGN PATENT DOCUMENTS

JP          07-263804 A     10/1995

OTHER PUBLICATIONS

J. W. Matthews, et al., "Defects in Epitaxial Multilayers", Journal of Crystal Growth, 1974, vol. 27, pp. 118-125.

*Primary Examiner* — Kinam Park
(74) *Attorney, Agent, or Firm* — Mattingly & Malur, PC

(57) ABSTRACT

An optical semiconductor device includes an InP substrate; an active layer disposed above the InP substrate; a n-type semiconductor layer disposed below the active layer; and a p-type clad layer disposed above the active layer, wherein the p-type clad layer includes one or more p-type $In_{1-x}Al_xP$ layers, the Al composition x of each of the one or more p-type $In_{1-x}Al_xP$ layers is equal to or greater than a value corresponding to the doping concentration of a p-type dopant, and the absolute value of the average strain amount of the whole of the p-type clad layer is equal to or less than the absolute value of a critical strain amount obtained by Matthews' relational expression, using the entire layer thickness of the whole of the p-type clad layer as a critical layer thickness.

11 Claims, 8 Drawing Sheets

(51) Int. Cl.
- *H01S 5/30* (2006.01)
- *H01S 5/026* (2006.01)
- *H01S 5/22* (2006.01)
- *H01S 5/343* (2006.01)
- *H01S 5/042* (2006.01)
- *H01S 5/02* (2006.01)
- *H01S 5/12* (2006.01)
- *H01S 5/34* (2006.01)

(52) U.S. Cl.
CPC .............. *H01S 5/0425* (2013.01); *H01S 5/12* (2013.01); *H01S 5/22* (2013.01); *H01S 5/305* (2013.01); *H01S 5/3054* (2013.01); *H01S 5/3063* (2013.01); *H01S 5/3072* (2013.01); *H01S 5/3201* (2013.01); *H01S 5/343* (2013.01); *H01S 5/3403* (2013.01); *H01S 5/3432* (2013.01); *H01S 5/34366* (2013.01)

(58) Field of Classification Search
CPC ...... H01S 5/3063; H01S 5/3072; H01S 5/305; H01S 5/343; H01S 5/34366; H01S 5/12; H01S 5/3201; H01S 5/3218; H01S 5/3403

See application file for complete search history.

(56) References Cited

U.S. PATENT DOCUMENTS

| | | | | |
|---|---|---|---|---|
| 5,635,735 | A * | 6/1997 | Miyamoto | H01L 29/7378 257/190 |
| 5,937,274 | A * | 8/1999 | Kondow | B82Y 20/00 257/186 |
| 2003/0173571 | A1* | 9/2003 | Kish, Jr. | B82Y 20/00 257/85 |
| 2003/0203531 | A1* | 10/2003 | Shchukin | B82Y 10/00 438/77 |
| 2004/0135136 | A1* | 7/2004 | Takahashi | B82Y 20/00 257/14 |
| 2007/0104236 | A1* | 5/2007 | Kobayashi | H01S 5/227 372/39 |

* cited by examiner

SMALL Al COMPOSITION

LARGE Al COMPOSITION

OPTICAL SEMICONDUCTOR DEVICE, OPTICAL SUBASSEMBLY, AND OPTICAL MODULE

CROSS-REFERENCE TO RELATED APPLICATION

The present application claims priority from Japanese application JP 2017-117176, filed on Jun. 14, 2017, the content of which is hereby incorporated by reference into this application.

BACKGROUND OF THE INVENTION

1. Field of the Invention

The present invention relates to an optical semiconductor device, an optical subassembly, and an optical module, and, in particular, to a technique for preventing variation in doping concentration of dopant in a clad layer of an optical semiconductor device.

2. Description of the Related Art

An optical semiconductor device may employ a so-called PIN structure in which an intrinsic (undoped) Multiple Quantum Well (MQW) layer is sandwiched between a p-type semiconductor layer and an n-type semiconductor layer. In this structure, the p-type and n-type semiconductor layers contains p-type and n-type dopants, respectively, that are doped thereinto so that the p-type and n-type semiconductor layers exhibit p-type and n-type conductivities, respectively.

SUMMARY OF THE INVENTION

To manufacture optical semiconductor devices at low costs, it is desirable to increase a device manufacturing yield. The following describes an example of a conventional semiconductor laser device in which an active layer and a p-type semiconductor layer (a p-type electrical conductive layer) are sequentially grown above an n-type semiconductor substrate. Variation in diffusion of p-type dopant from the p-type semiconductor layer or the like toward the active layer affects the device characteristics and reliability of the semiconductor laser devices, which deteriorates the manufacturing yield.

The inventors of the present invention have studied in detail the cause of variation in diffusion of p-type dopant to find the following. That is, a dopant atom diffusion length is determined based on a diffusion constant, which is a value unique to an atom, and a diffusion time. The diffusion time remains constant in actual manufacturing processing in which manufacturing repeats based on the same specifications. Accordingly, the main cause of variation in diffusion is expected to be variation in the diffusion constant itself. The diffusion constant is a parameter depending on diffusion temperature and doping concentration, and the diffusion temperature is expected to be constant in actual manufacturing processing, similar to the diffusion time. In view of the above, variation in diffusion is expected to be largely attributed to variation in the doping concentration. The inventors have studied in detail the cause of variation in the doping concentration to find that stability in supply of dopant material is critical.

The amount of dopant material to be supplied is very small and vulnerable to the condition (absorption or the like) inside a supply path, such as a pipe or a device. Thus, particular attention should be paid to the process of supplying material. Further, the recent demand for higher performance of optical semiconductor devices requires a very precise level of control of a diffusion length, which cannot be achieved through processing same as conventional processing. Furthermore, diffusion of dopant from a clad layer positioned near the active layer is expected to be largely influential.

The present invention has been conceived in view of the above, and it is an object of the present invention to provide an optical semiconductor device, an optical subassembly, and an optical module that are manufactured at lower costs, which is achieved by reducing variation in supply of dopant material.

(1) In order to achieve the above described object, according to one aspect of the present invention, there is provided an optical semiconductor device including: an InP substrate; an active layer disposed above the InP substrate; a semiconductor layer of a first conductivity type disposed below the active layer; and a clad layer of a second conductivity type disposed above the active layer, wherein the clad layer of the second conductivity type includes one or more $In_{1-x}Al_xP$ layers of the second conductivity type, the Al composition x of each of the one or more $In_{1-x}Al_xP$ layers of the second conductivity type is equal to or greater than a value corresponding to the doping concentration of a dopant of the second conductivity type, and the absolute value of the average strain amount of the whole of the clad layer of the second conductivity type is equal to or less than the absolute value of a critical strain amount obtained by Matthews' relational expression, using the entire layer thickness of the whole of the clad layer of the second conductivity type as a critical layer thickness.

(2) In the optical semiconductor device described in above (1), the clad layer of the second conductivity type may include one $In_{1-x}Al_xP$ layer of the second conductivity type, the Al composition x of the one $In_{1-x}Al_xP$ layer of the second conductivity type may be equal to or greater than a value corresponding to the doping concentration of the dopant of the second conductivity type in the one $In_{1-x}Al_xP$ layer of the second conductivity type, and the absolute value of the strain amount of the one $In_{1-x}Al_xP$ layer of the second conductivity type may be equal to or less than the absolute value of a critical strain amount obtained by the Matthews' relational expression, using the layer thickness of the one $In_{1-x}Al_xP$ layer of the second conductivity type as the critical layer thickness.

(3) In the optical semiconductor device described in above (1), the clad layer of the second conductivity type may include one InP layer of the second conductivity type and one $In_{1-x}Al_xP$ layer of the second conductivity type, the Al composition x of the one $In_{1-x}Al_xP$ layer of the second conductivity type may be equal to or greater than a value corresponding to the doping concentration of the dopant of the second conductivity type in the one $In_{1-x}Al_xP$ layer of the second conductivity type, and the absolute value of the strain amount of the one $In_{1-x}Al_xP$ layer of the second conductivity type may be equal to or less than the absolute value of the strain amount of the one $In_{1-x}Al_xP$ layer of the second conductivity type, the strain amount being obtained based on the average strain amount of the whole of the clad layer of the second conductivity type, the average strain amount being a critical strain amount obtained by Matthews' relational expression, using the entire layer thickness of the whole of the clad layer of the second conductivity type as the critical layer thickness.

(4) In the optical semiconductor device described in above (1), the clad layer of the second conductivity type may include the n (n being an integer equal to or greater than two) number of $In_{1-x}Al_xP$ layers of the second conductivity type and the (n−1) number of InP layers of the second conductivity type each being disposed between adjacent $In_{1-x}Al_xP$ layers of the second conductivity type of the n number of the $In_{1-x}Al_xP$ layers.

(5) In the optical semiconductor device described in any of (1) to (4) above, the optical semiconductor device may be a semiconductor light-emitting element, the InP substrate may be an InP substrate of the first conductivity type, and the layer thickness of the whole of the clad layer of the second conductivity type may be equal to or greater than 0.5 μm and equal to or less than 2 μm.

(6) The optical semiconductor device described in above (5) may further include a grating layer disposed between the active layer and the clad layer of the second conductivity type.

(7) In the optical semiconductor device described in any of (1) to (4) above, the optical semiconductor device may be a semiconductor optical modulator, the InP substrate may be an InP substrate of the first conductivity type, and the layer thickness of the whole of the clad layer of the second conductivity type may be equal to or greater than 0.5 μm and equal to or less than 2 μm.

(8) In the optical semiconductor device described in any of (1) to (4) above, the optical semiconductor device may be a semiconductor light-receiving element, the InP substrate may be a semi-insulating InP substrate, and the layer thickness of the whole of the clad layer of the second conductivity type may be equal to or greater than 0.5 μm and equal to or less than 2 μm.

(9) In the optical semiconductor device described in any of (1) to (8) above, the first conductivity type may be an n-type, the second conductivity type may be a p-type, and the dopant of the second conductivity type may be one or more atoms selected from a group consisting of Zn, Mg, and Be.

(10) According to another aspect of the present invention, there is provided an optical subassembly including the optical semiconductor device described in any of (1) to (9).

(11) According to still another aspect of the present invention, there is provided an optical module including the optical assembly described in (10).

The present invention provides an optical semiconductor device, an optical subassembly, and an optical module manufactured at lower costs, which is achieved by reducing variation in supply of dopant material.

DETAILED DESCRIPTION OF THE INVENTION

Figure 1:
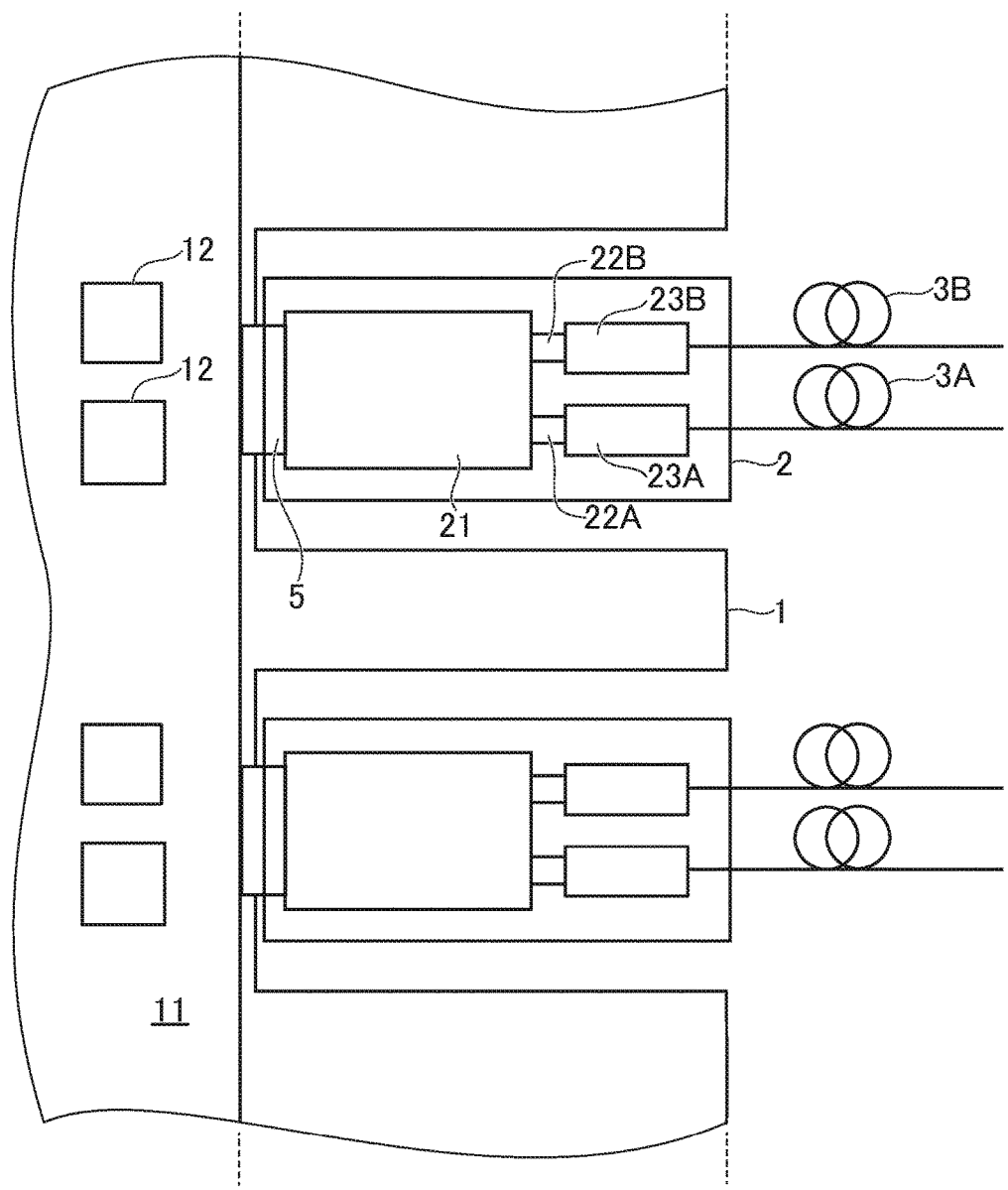
FIG. 1 is a schematic view of the structure of an optical transmission equipment and optical modules according to a first embodiment of the present invention.

The following specifically describes embodiments of the present invention in detail. In all drawings to describe the embodiments, parts having the same function are given the same reference numerals and will not repetitively described. The accompanying drawings are available to describe examples of the embodiments, and the sizes of any parts illustrated in the drawings do not necessarily match with the scales mentioned in the description of the embodiments.

First Embodiment

FIG. 1 is a schematic view of the structure of an optical transmission equipment 1 and optical modules 2 according to a first embodiment of the present invention. The optical transmission equipment 1 has a printed circuit board (PCB) 11 and an integrated circuit (IC) 12. The optical transmission equipment 1 is, for example, a large capacitor router or switch. The optical transmission equipment 1 has, for example, a function as an exchanger and is disposed in a base station or the like. The optical transmission equipment 1 has a plurality of optical modules 2 and receives data (a reception electric signal) from the optical module 2, determines which data is to be sent to where, using the IC 12 or the like, generates data for transmission (a transmission electric signal), and sends the data to a relevant optical module 2 via the printed circuit board 11.

The optical module 2 is a transceiver having a transmission function and a receiving function. The optical module 2 includes a printed circuit board 21, an optical receiver module 23A that converts an optical signal received via an optical fiber 3A into an electric signal, and an optical transmission module 23B that converts an electric signal into an optical signal to send to an optical fiber 3B. The printed circuit board 21 is connected to the optical receiver module 23A and the optical transmission module 23B, respectively, via respective flexible printed circuit boards (FPC) 22A and 22B. The optical receiver module 23A sends an electric signal via the flexible printed circuit board 22A to the printed circuit board 21, and the printed circuit board 21 sends an electric signal via the flexible printed circuit board 22B to the optical transmission module 23B. The optical module 2 and the optical transmission equipment 1 are connected to each other via an electric connecter 5. The optical receiver module 23A and the optical transmission module 23B are electrically connected to the printed circuit board 21 and convert an optical/electric signal into an electric/optical signal, respectively. The optical receiver module 23A includes one or more optical subassemblies, while the optical transmission module 23B includes one or more optical subassemblies.

The transmission system according to this embodiment includes two or more optical transmission equipments 1, two or more optical modules 2, and one or more optical fibers 3 (for example, 3A and 3B in FIG. 1). Each of the optical transmission equipments 1 is connected to one or more optical modules 2. The optical modules 2 connected to two respective optical transmission equipments 1 are connected to each other via the optical fiber 3. Transmission data generated by one optical transmission equipment 1 is converted into an optical signal by the optical module 2 connected, and the optical signal is then sent to the optical fiber 3. The optical signal transmitted through the optical fiber 3 is received by the optical module 2 connected to the other optical transmission equipment 1, and the optical module 2 converts the optical signal into an electric signal to send as reception data to the other optical transmission equipment 1.

Figure 2:
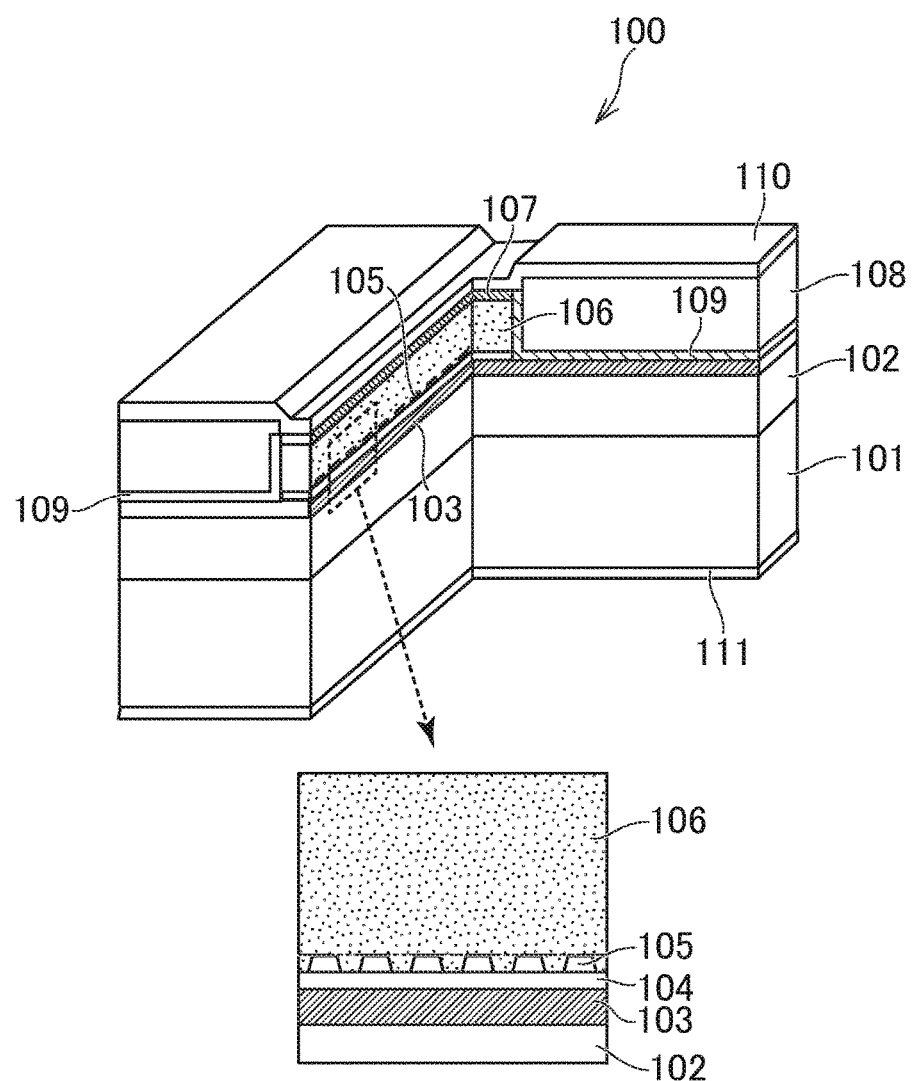
FIG. 2 is a bird's eye view of a semiconductor layer device according to the first embodiment of the present invention.

FIG. 2 is a bird's eye view of a semiconductor laser device 100 according to this embodiment. The semiconductor laser device 100 according to this embodiment is an optical semiconductor device that is a distributed feedback (DFB) semiconductor laser device and is directly modulated. For understanding of the structure of the semiconductor laser device 100, FIG. 2 illustrates a cross section along the growth direction, the cross section including the center of a light waveguide, and a cross section along the growth direction and perpendicular to the former cross section. The semiconductor laser device 100 is an optical semiconductor device to be mounted on an optical subassembly of the optical transmission module 23B. Although the semiconductor laser device 100 has a ridge waveguide (RWG) structure here, this is not an exclusive example, and the semiconductor laser device 100 may have other structure such as a buried-hereto (BH) structure.

As illustrated in FIG. 2, multiple semiconductor layers including an n-type InP buffer layer 102, a Multi-Quantum-Well (MQW) layer 103, a p-type InP spacer layer 104, a grating layer 105, a p-type InAlP clad layer 106, and a $p^+$-type InGaAs contact layer 107, are formed on an n-type InP substrate 101, and the multiple semiconductor layers constitute a mesa structure. The MQW layer 103 consists of repetitive layers including a well layer and a barrier layer both made of InGaAlAs. On the respective sides of the mesa structure (and a part of the upper surface of the mesa structure) and in areas extending sideways from the bottom of the mesa structure on the respective both sides of the mesa structure, the passivation film 109 is disposed. The mesa structure is planarized with polyimide 108 on the respective sides of the mesa structure. An upper electrode 110 is disposed physically in contact with (at least a part of) the upper surface of the $p^+$-type InGaAs contact layer 107 and extending sideways on the respective both sides of the multiple semiconductor layers. Further, a lower electrode 111 is disposed physically in contact with the rear surface of the n-type InP substrate 101. To achieve a single mode oscillation spectrum, the grating layer 105 is disposed between the p-type InP spacer layer 104 and the p-type InAlP clad layer 106.

The semiconductor laser device 100 according to this embodiment includes an active layer disposed on the n-type InP substrate 101 and a p-type clad layer disposed on the active layer. The active layer includes the MQW layer 103. The active layer is composed of the MQW layer 103 here. This, however, is not an exclusive example, and, for example, the active layer may additionally include a separate confinement heterostructure layer (SCH layer) in addition to the MQW layer. The semiconductor laser device 100 further includes an n-type semiconductor layer disposed under the active layer. The n-type semiconductor layer corresponds to the n-type InP buffer layer 102 here. However, the n-type semiconductor layer may include the n-type InP substrate 101 itself with the n-type InP buffer layer 102 not essential. In this case, the n-type semiconductor layer corresponds to the n-type InP substrate 101.

The active layer is disposed above the n-type InP substrate 101 via a semiconductor layer (the n-type InP buffer layer 102). The p-type clad layer includes one or more p-type InAlP layers. The p-type clad layer is composed of one p-type InAlP clad layer 106 here. The p-type InAlP clad layer 106 (a p-type clad layer) is disposed above the active layer (the MQW 103) via semiconductor layers (the p-type InP spacer layer 104 and the grating layer 105). In this specification, "a B layer is disposed above an A layer" refers to a case in which the B layer is not disposed on the A layer physically in contact with the A layer but is disposed above the A layer via another layer in-between and a case in which the B layer is disposed on the A layer physically in contact with the A layer. This is similarly applied to "a B layer is disposed below an A layer".

In this specification, in the case where the multiple semiconductor layers include a grating layer, the p-type clad layer is assumed to include a semiconductor layer or semiconductor layers disposed between the upper surface of the grating layer and the lower surface of the p-type contact layer. Meanwhile, in the case where the multiple semiconductor layers do not include a grating layer disposed on the active layer, the p-type clad layer is assumed to include a semiconductor layer or semiconductor layers disposed between the upper surface of the active layer and the lower surface of the p-type contact layer.

With the recent explosion of Internet users, rapid speeding up and larger capacity of data transmission are required, and optical communication is expected to remain important as ever. Conventionally, an optical semiconductor device used as a light source for optical communication mainly includes a semiconductor laser device. For short-distance transmission up to about 10 km, a direct modulation for directly driving a semiconductor laser device with an electric signal is mainly used. Meanwhile, for long-distance transmission in excess of about 10 km, an electro-absorption (EA) modulator integrated semiconductor laser device including an integrated optical modulator is used because sole use of direct modulation of a semiconductor laser is insufficient to achieve such long-distance transmission. For further spread of optical communication, not only higher capability of such semiconductor laser devices but also low-cost supply of such devices is increasingly important. The present invention is optimal for such semiconductor laser devices.

The following describes a method for manufacturing the semiconductor laser device 100 according to this embodiment. Respective semiconductor layers included in the multiple semiconductor layers are sequentially grown on the n-type InP substrate 101 through metal-organic vapor phase epitaxy (MOVPE) so as to constitute a mesa structure (multiple semiconductor layers fabrication step). The carrier gas used here is hydrogen. Material of Group III element is selected as necessary from the group consisting of trimethyl aluminum (TMA), triethyl gallium (TEG), and trimethylindium (TMI). Material of Group V element is selected as necessary from the group consisting of arsine ($A_sH_3$) and phosphine ($PH_3$). N-type dopant is Si, for which disilane ($Si_2H_6$) is used. P-type dopant is Zn, for which dimethyl zinc (DMZn) is used. Although Zn is used as a p-type dopant, this is not an exclusive example, and either Mg or Be or two or more atoms selected from the group consisting of Zn, Mg, and Be may be used. In this case, material containing the selected one or more atoms can be used. A crystal growth is not limited to the MOVPE, and any crystal growth, such as molecular beam epitaxy (MBE), chemical beam epitaxy (CBE), or metal-organic molecular beam epitaxy (MOMBE), may be used.

The multiple semiconductor layers manufacturing step is specifically executed as described below. Firstly, the n-type InP buffer layer 102 is crystal grown on the n-type InP substrate 101. Secondly, the MQW layer 103 made of InGaAlAs, the p-type InP spacer layer 104, a semiconductor layer for formation of a grating, and a p-type InP cap layer are sequentially crystal grown on the n-type InP buffer layer 102. Generally, a p-type InP cap layer is disposed for protection on the upper surface of the semiconductor layer for a grating. Thirdly, a grating is formed through well-known process. Fourthly, grating is buried by p-type InAlP to thereby form the grating layer 105. Further, the p-type InAlP clad layer 106 is grown on the grating layer 105, and a p$^+$-type InGaAs contact layer 107 is grown. The thickness of the p-type InAlP clad layer 106 is 1 μm, the Al composition x thereof is 0.001, and the strain thereof is −0.007%. Fifthly, in an area of the multiple semiconductor layers, the area constituting a light waveguide in a plan view, a mesa stripe mask is formed, and a mesa structure is formed through etching.

The passivation film 109 is formed on the upper surface of the multiple semiconductor layers and the polyimide 108 except (at least a part of) the upper surface of the p$^+$-type InGaAs contact layer 107 (passivation film forming step). The polyimide 108 is buried for planarization on the respective sides of the multiple semiconductor layers constituting the mesa structure (burying step). The upper electrode 110 is formed so as to be physically in contact with (at least a part of) the upper surface of the p$^+$-type InGaAs contact layer and so as to extend sideways on the respective both sides of the multiple semiconductor layers, and further, the lower electrode 111 is formed so as to be physically in contact with the rear surface of the n-type InP substrate 101 (electrode forming step). With the above, the wafer step ends. Thereafter, the wafer is cleaved into bar pieces, an insulating film is formed on the light emitting face and its opposite face, and the respective bar pieces are cut into chips, whereby the semiconductor laser device 100 is fabricated (an optical semiconductor device forming step). The above has described the method for manufacturing the semiconductor laser device 100 according to this embodiment.

Use of the p-type InAlP clad layer 106 to form the p-type clad layer according to the above described manufacturing method improves the efficiency in utilizing the material (that is, material utilizing efficiency) in manufacturing, and significantly reduces variation in atomic concentration of the p-type dopant even though the multiple semiconductor layers are formed through a plurality of times of crystal growth, using the same manufacturing device. This improves the manufacturing yield of the semiconductor laser device 100.

A first characteristic of the semiconductor laser device 100 according to this embodiment is that the p-type clad layer is composed of one p-type In$_{1-x}$Al$_x$P layer. A second characteristic is that the Al composition x (the strain amount ε) of the p-type In$_{1-x}$Al$_x$P layer is within the range to be described later. The Al composition x of the one p-type In$_{1-x}$Al$_x$P layer is equal to or greater than a value corresponding to the doping concentration of the p-type dopant in the one p-type In$_{1-x}$Al$_x$P layer. That is, the lower limit x1 of the Al composition x is equal to that value. The absolute value of the strain amount ε of the one p-type In$_{1-x}$Al$_x$P layer is equal to or less than the absolute value of a critical strain amount ε$_c$ obtained by Matthews' relational expression using the layer thickness of the one p-type In$_{1-x}$Al$_x$P layer as a critical layer thickness t$_c$. That is, the upper limit x2 of the Al composition x is equal to the value of the Al composition x corresponding to the critical strain amount ε$_c$. The values of the lower limit x1 and the upper limit x2 will be described later in detail.

Whereas the base of a conventional p-type clad layer is mainly made of InP, the base of the p-type clad layer of the semiconductor laser device 100 according to this embodiment is made of In$_{1-x}$Al$_x$P (x being very small with respect to one: x indicating a very small amount). This can improve stability in the doping concentration of a p-type dopant. The Al composition x of the p-type InAlP clad layer 106 of the semiconductor layer device 100 according to this embodiment is 0.001, the strain amount thereof is −0.007%, and the layer thickness thereof is 1 μm. For the semiconductor laser device 100, it is desirable that the layer thickness of the p-type clad layer (the p-type InAlP clad layer 106) is equal to or greater than 0.5 μm and equal to or less than 2 μm. Below, the first characteristic will be considered.

Figure 3:
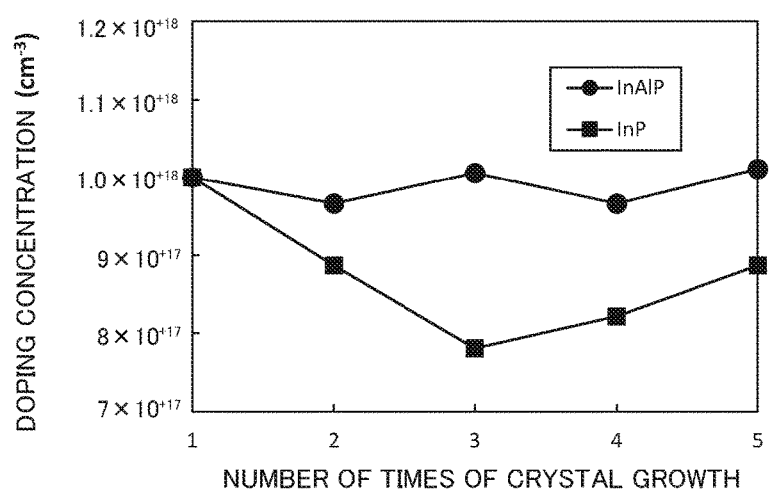
FIG. 3 indicates the result of experiments in connection with the number of times of crystal growth and the concentration of p-type dopant.

FIG. 3 is a graph showing a relation between the number of times of crystal growth and the doping concentration of p-type dopant. FIG. 3 shows the relation experimentally. FIG. 3 shows the relations concerning a case in which a clad layer doped with p-type dopant is composed of a single p-type InAlP (In$_{1-x}$Al$_x$P: x indicating a very small amount) layer and a case in which the clad layer is composed of a single p-type InP layer. The number of times of crystal growth refers to the number of times the semiconductor laser device 100 is formed (that is, the semiconductor layer device 100 is grown on a semiconductor substrate) in sequential formation of the semiconductor laser devices 100 from the initial state (for example, immediately after cleaning of a manufacturing tool), using the same manufacturing device. That is, "the doping concentration at k$^{th}$ crystal growth" (cases with k being one to five are shown in the graph) refers to the doping concentration of the p-type dopant in the p-type clad layer of the semiconductor laser device 100 formed at the k$^{th}$ time.

In the respective cases where the clad layer is composed of a p-type InAlP layer and of a p-type InP layer, the design value of the doping concentration of the p-type dopant is 1×10$^{18}$ cm$^{-3}$, and the same amount of p-type dopant is introduced. In the case where the clad layer is composed of a p-type InP layer, the doping concentration of the p-type dopant does not reach the design value, namely, 1×10$^{-18}$ cm$^{-3}$, except in the first crystal growth, but varies by 20% at maximum, depending on the number of times of crystal growth. In other words, the doping concentration is not stable. This variation is caused toward the lower concentration side, that is, the doping concentration does not reach the design value. This means that the p-doping materials are not supplied as intended. Meanwhile, in the case where the clad layer is composed of a p-type InAlP layer, the doping concentration of the p-type dopant fluctuates near the aimed value, namely, 1×10$^{18}$ cm$^{-3}$, exhibiting very high stability, irrespective of the number of times of crystal growth.

Based on these results, the inventors have concluded that the above-mentioned effect is obtained by the mechanism mentioned below. That is, in the case of a clad layer (a semiconductor layer) composed of an InP layer (containing no Al), the amount of the p-type dopant material delivered to the wafer varies among a plurality of times of crystal growth as the p-type dopant material is severely affected by the condition in a supply path, such as inside a pipe or inside a device, at the material supplying step. Meanwhile, for a clad layer composed of an InAlP layer, it is assumed that such influence can be significantly reduced. As a p-type dopant is more vulnerable to the influence than an n-type dopant, the present invention produces a significant effect when a p-type clad layer is disposed on an active layer.

Although the details of this effect are not yet known, it is expected that supply of p-type dopant material together with Al material reduces a factor (impurities or the like) that makes the p-type dopant material gas readily adhered onto a pipe or a reaction pipe on the way. This can reduce variation in the amount of the p-type dopant supplied and thus variation in the doping concentration of the p-type dopant. As a result, the p-type InAlP clad layer 106 is stably manufactured. The semiconductor laser device 100 according to this embodiment exhibits improved stability of the doping concentration of the p-type dopant, in which the device manufacturing yield is improved as compared with a conventional semiconductor laser device, and the manufacturing costs of the semiconductor laser device 100 is reduced.

The above has described the first characteristic. Below, the second characteristic will be explained.

Addition of Al into InP makes InAlP, whose lattice constant is smaller than that of InP. Thus, InAlP is subjected to tensile strain relative to InP. Increase in (the absolute value of) the strain amount causes crystal defect with the p-type clad layer, which can deteriorate device characteristic and reliability of the semiconductor laser device 100. In view of the above, the influence of tensile strain on crystals will be considered below.

The optimum range of the Al composition x of a p-type $In_{1-x}Al_xP$ layer will be considered. Firstly, the lower limit x1 of the Al composition x will be described. Supplying Al material to add Al atom to a semiconductor layer (a p-type clad layer) can produce an effect of stabilized doping concentration of the p-type dopant in the p-type clad layer. In view of the above, it is desirable that the amount of Al atom equivalent to or greater than the doping concentration (the concentration of p-type atom) of a p-type dopant is added to at least the p-type InAlP layer.

In the case where the p-type clad layer is composed of one p-type InAlP layer, desirably, "x" of the Al composition is a value equivalent to or greater than a value corresponding to the doping concentration of the p-type dopant. That is, the value corresponding to the doping concentration of the p-type dopant is the lower limit x1 of the Al composition x. The atomic concentration y of Al at the lower limit x1 is equal to the atomic concentration y of the p-type dopant, and the Al composition x corresponding to that atomic concentration can be obtained by Expression (1) below.

[Expression 1]

$$y = (1.98 \times 10^{22}) \cdot x \quad (1)$$

Figure 4A:
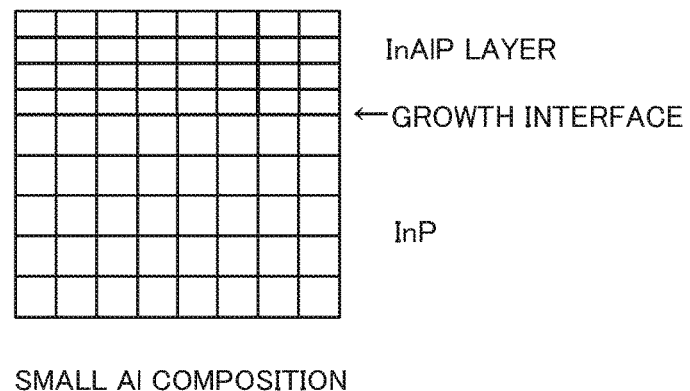
FIGS. 4A and 4B are schematic diagram of an InAlP layer being crystal growing on an InP layer.
Figure 4B:
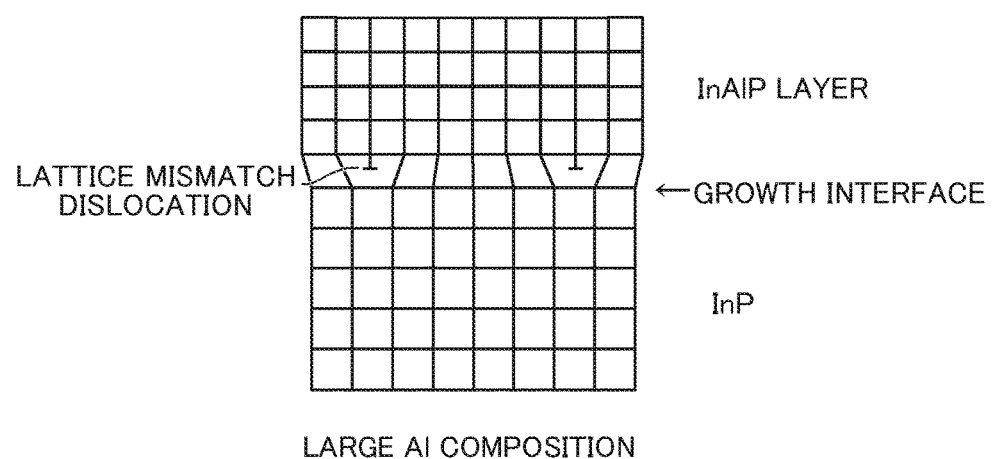

Secondly, the upper limit x2 (the upper limit of the absolute value of the strain amount ε) of the Al composition x will be described. FIGS. 4A and 4B are schematic views of an InAlP layer crystal growing on an InP layer. FIG. 4A is related to a case of a small Al composition x, while FIG. 4B is related to a case of a large Al composition x. As illustrated in FIG. 4A, in the case of a small Al composition x, the influence of tensile strain is small, and the lattice constant of the InAlP layer in the horizontal direction (in the lateral direction of the drawing) becomes larger so as to match with that of InP. At the same time, the lattice constant of the InAlP layer in the vertical direction (in the longitudinal direction of the drawing) becomes smaller. That is, an InAlP layer continues crystal growing with lattice deformation, but not causing lattice mismatch dislocation. This condition is referred to as a pseudomorphic state and has almost no influence on the crystal quality. Meanwhile, as illustrated in FIG. 4B, in the case of a large Al composition x, tensile strain is too large to keep lattice deformation, and lattice mismatch dislocation is caused on the growth interface and an InAlP layer continues growing at almost its inherent lattice constant. Lattice mismatch dislocation can cause loss component of the carrier capture center or the optical loss, thus deteriorating the device characteristic of the semiconductor laser device 100. In substantially such condition, the performance of the semiconductor laser device (an optical semiconductor device) significantly deteriorates. In view of the above, it is desirable that the Al composition x of the p-type InAlP layer contained in the p-type clad layer of the semiconductor laser device 100 according to this embodiment is set within a range that maintains the condition illustrated in FIG. 4A and does not cause lattice mismatch dislocation. This determines the upper limit x2 of the Al composition x.

A relational expression relevant to a critical layer thickness that does not cause lattice mismatch dislocation and a tolerable critical strain at the time is described (as Expression 5) on pages 118 to 125, vol. 27, Journal of Crystal Growth, 1974, by Matthews and Blakeslee, with Expression (2) below given.

[Expression 2]

$$\varepsilon_c = \frac{b}{2\pi t_c} \cdot \frac{(1 - v\cos^2\psi)}{(1 + v)\cos\varphi} \left[ \ln\left(\frac{t_c}{b}\right) + 1 \right] \quad (2)$$

In the above, $\varepsilon_c$ indicates a critical strain amount, $t_c$ indicates a critical layer thickness, b indicates a Burgers vector, ψ indicates an angle defined by a dislocation line and a Burgers vector, φ indicates an angle defined by a slip direction and a film surface, and v indicates Poisson's ratio. In this specification, for convenience, Expression (2) will be referred to as Matthews' relational expression.

In the case where the p-type clad layer is composed of one p-type InAlP layer, the absolute value of the strain amount ε of the one p-type InAlP layer is desired to be equal to or less than the absolute value of a critical strain amount $\varepsilon_c$ that can be obtained by substituting the layer thickness of the one p-type InAlP layer (the p-type clad layer) as a critical layer thickness $t_c$ into Matthews' relational expression, or Expression (2). That critical strain amount $\varepsilon_c$ determines the upper limit of (the absolute value of) a strain amount that maintains the pseudomorphic state, and the value of the Al composition x corresponding to that strain amount makes the upper limit x2 of the Al composition x of the p-type clad layer. The value of the Al composition x corresponding to the strain amount ε of the p-type clad layer is given by Expression (3) below.

[Expression 3]

$$x = \left| \frac{a_0}{a - a_0} \varepsilon \right| = 14.5\varepsilon \quad (3)$$

In the above, a indicates the lattice constant of InAlP and is 5.463 Å, and $a_0$ indicates the lattice constant of InP and is 5.869 Å. Expression (3) provides an Al composition x corresponding to the critical strain amount $\varepsilon_c$.

The p-type clad layer according to this embodiment is composed of one p-type InAlP clad layer 106, which, however, is not an exclusive example. In the semiconductor laser device 100 according to this embodiment, as illustrated in FIG. 2, the grating layer 105 is disposed between the p-type InP spacer layer 104 and the p-type InAlP clad layer 106. In the case where a p-type InAlP layer is re-grown directly on a grating, the surface morphology could deteriorate, depending on the condition of the grating. As the Al atom is expected to more unlikely migrate on a crystal growing surface as compared with the In atom, the concaves and convexes of the grating may not be readily planarized.

Accordingly, the semiconductor laser device 100 according to another example of the embodiment may have the structure described below. In the case where the difference in height between concaves and convexes of the grating is large, it is more difficult to bury the grating to make a planar surface. In view of the above, the semiconductor laser device 100 according to the other example has a very thin p-type InP layer disposed on the grating so that the grating is buried by the p-type InP to form the grating layer 105. This also can planarize a p-type InP layer to be disposed on the grating layer 105. A p-type InAlP layer can be disposed on the p-type InP layer. In this case, the p-type clad layer can be composed of a pair of a p-type InP layer and a p-type InAlP layer (one p-type InP layer and one p-type InAlP layer). A p-type InP layer and a p-type InAlP layer are sequentially grown here. With the above, a p-type clad layer having good quality can be formed, and the present invention can produce a significant effect. Since the lowest layer in the p-type clad layer is a p-type InP layer, variation in doping concentration of the p-type dopant can be a concern. However, as the thickness of the p-type clad layer is as thin as 100 nm or less, which is very thin as compared with a p-type InAlP layer, the influence of the lowest layer made of InP is substantially ignorable. This structure of the p-type clad layer produces a significant effect when the grating layer 105 is disposed between the active layer and the p-type clad layer.

Alternatively, the concaves and convexes of the grating may be planarized by disposing a very thin p-type InAlP layer at an atomic layer level (about 1 nm) on the grating, and a p-type InP layer may be further disposed thereon. The lowest p-type InAlP layer can prevent decrease in doping concentration of the p-type dopant. Another p-type InAlP layer can be disposed on the planarized p-type InP layer.

The below describes a case in which the p-type clad layer is composed of one p-type InP layer and one p-type InAlP layer. It is desirable that the Al composition x of the one p-type InAlP layer is equal to or greater than a value corresponding to the doping concentration of the p-type dopant in the one p-type InAlP layer. That is, that value makes the lower limit x1 of the Al composition x. As described above, Expression (1) can provide the lower limit x1 of the Al composition x. It is also desirable that the absolute value of the strain amount E of the one p-type InAlP layer is equal to or less than the absolute value of the strain amount ε of the one p-type InAlP layer that is obtained based on an average strain amount $\varepsilon_{av}$ of the whole p-type clad layer as a critical strain amount $\varepsilon_c$. The critical strain amount $\varepsilon_c$ is obtained by Matthews's relational expression, or Expression (2), using the entire layer thickness of the whole p-type clad layer as a critical layer thickness $t_c$. That is, it is desirable that the absolute value of the average strain amount $\varepsilon_{av}$ of the whole p-type clad layer is equal to or less than the absolute value of the critical strain amount $\varepsilon_c$ obtained by Matthews' relational expression, or Expression (2), using the entire layer thickness of the whole p-type clad layer as a critical layer thickness $t_c$, and the strain amount ε of the p-type InAlP layer based on the average strain amount $\varepsilon_{av}$ of the whole p-type clad layer is obtained by Expression (4) below.

[Expression 4]

$$\varepsilon_{av} = \frac{(t_1 \cdot \varepsilon)}{t_0 + t_1} \quad (4)$$

In the above, $t_0$ indicates the layer thickness of the p-type InP layer, $t_1$ indicates the layer thickness of the p-type InAlP layer, and ε indicates the strain amount of the p-type InAlP layer. It is desirable that the p-type InP layer is sufficiently thin, as compared with the p-type InAlP layer. That is, the layer thickness $t_0$ of the p-type InP layer is sufficiently small as compared with the layer thickness $t_1$ of the p-type InAlP layer, and the critical strain amount $\varepsilon_c$ obtained by Matthews' relational expression is substantially equal to the upper limit of the strain amount ε of the p-type InAlP layer. The layer thickness $t_0$ of the p-type InP layer is desirably equal to or less than 25% of the layer thickness $t_1$ of the p-type InAlP layer, and more desirably equal to or less than 10%.

The p-type clad layer may include a plurality of p-type InAlP layers. In this case, it is desirable that a p-type InP layer is disposed between adjacent p-type InAlP layers. For example, in the case where the p-type clad layer includes the n (n being an integer equal to or greater than two) number of p-type InAlP layers, the (n−1) number of p-type InP layers are each disposed between adjacent p-type InAlP layers of the n number of p-type InAlP layers. It is further desirable that a p-type InP layer is disposed between the lowest p-type InAlP layer and the grating layer 105 (or the active layer). In this case, the p-type clad layer is composed of the n number of p-type InP layers and the n number of p-type InAlP layers. That is, the p-type clad layer has a multilayer structure including the n number of units repetitively grown, each unit including a p-type InP layer and a p-type InAlP layer.

Figure 5:
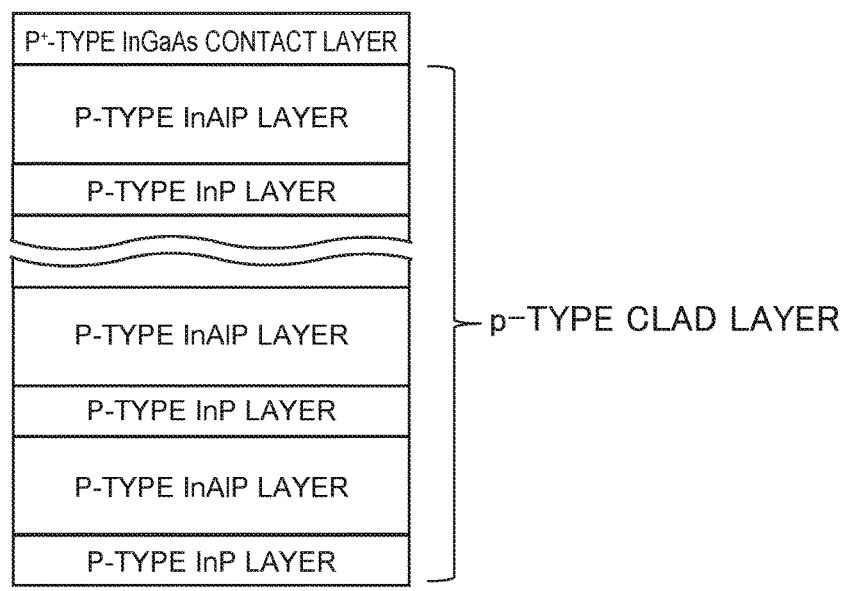
FIG. 5 schematically illustrating a p-type clad layer according to the first embodiment, having a multilayer structure.

FIG. 5 is a schematic diagram of a p-type clad layer according to this embodiment, having a multilayer structure. As illustrated in FIG. 5, in order to reduce the influence of tensile strain, the p-type clad layer has a multilayer structure in which the n number of p-type InP layers and the n number of p-type InAlP layers are alternately grown. The Al composition of an $i^{th}$ (i being any integer that holds 1<=i<=n) p-type InAlP layer, counted from the bottom, of the n number of p-type InAlP layers is defined as $x_i$, the strain amount thereof is defined as $\varepsilon_i$, and the layer thickness thereof is defined as $t_i$. The average strain amount $\varepsilon_{av}$ of the whole p-type clad layer is obtained by Expression (5) below.

[Expression 5]

$$\varepsilon_{av} = \frac{\sum_{i=1}^{n} (t_i \cdot \varepsilon_i)}{t_0 + \sum_{i=1}^{n} t_i} \quad (5)$$

In the above, $t_0$ is the total layer thickness of the n number of p-type InP layers (that is, the total layer thickness of one or more p-type InP layers). As indicated by Expression (5), inclusion of the n number of p-type InP layers in the p-type clad layer can reduce the average strain amount $\varepsilon_{av}$ with respect to the whole p-type clad layer The Al compositions $x_i$, the strain amounts $\varepsilon_i$, and the layer thicknesses $t_i$ of the n number of respective p-type InAlP layers may differ from one another. In the multilayer structure illustrated in FIG. 5, the behavior of the p-type dopant for the doping concentration in the p-type InP layer disposed between the adjacent p-type InAlP layers could be a concern. In view of the above, the inventors have conducted an experiment to find that, in the case where a p-type InAlP layer is grown and supply of Al material is thereafter stopped, the stoppage up to about ten minutes or less has little influence. That is, the inventors have verified that the present invention can provide a sufficient effect with respect to a p-type clad layer having a multilayer structure.

In the case where the p-type clad layer includes the n number of p-type InAlP layers with p-type InP layers each disposed between adjacent p-type InAlP layers, such as, for example, in the case where the p-type clad layer has the multilayer structure illustrated in FIG. 5, the lower limit x1 of the Al composition x of each of the n number of respective p-type InAlP layers is determined by the p-type InAlP layer with the lowest doping concentration of the p-type dopant of the n number of p-type InAlP layers. That is, it is desirable that the Al compositions x of all the n number of p-type InAlP layers are equal to or greater than a value corresponding to the doping concentration of the p-type dopant in the p-type InAlP layer with the lowest doping concentration of the p-type dopant. That is, that value makes the lower limit x1 of the Al compositions x of all the n number of p-type InAlP layers. The atomic concentration y of Al in the p-type clad layer at the lower limit x1 is equal to the doping concentration y (atomic concentration) of the p-type dopant in the p-type InAlP layer with the lowest doping concentration of the p-type dopant, and the Al composition x corresponding to that doping concentration can be obtained by Expression (1). With the Al compositions x of all the n number of InAlP layers being equal to or greater than the lower limit x1, an effect of stabilized doping concentration of the p-type dopant can be obtained at least in the p-type InAlP layer with the lowest doping concentration of the p-type dopant.

It is further desirable that the Al composition $x_i$ of an $i^{th}$ p-type InAlP layer of the p-type InAlP layers (the n number of p-type InAlP layers) is equal to or greater than a value corresponding to the doping concentration of the p-type dopant in the $i^{th}$ p-type InAlP layer. That is, that value makes the lower limit x1 of the Al composition x of each of the n number of p-type InAlP layers. With the Al composition x of each p-type InAlP layer being equal to or greater than a value corresponding to the doping concentration of the p-type dopant in that p-type InAlP layer, a significant effect of further stabilized doping concentration of the p-type dopant in the p-type clad layer can be achieved in each of the n number of p-type InAlP layers.

It is further desirable that the lower limits x1 of the Al compositions x of all the n number of p-type InAlP layers are equal to a value corresponding to the doping concentration of the p-type dopant in a p-type InAlP layer with the highest doping concentration of the p-type dopant. With the above, a significant effect of further stabilized doping concentration of the p-type dopant in the p-type clad layer can be achieved in each of the n number of p-type InAlP layers.

Although the upper limit x2 of the Al composition $x_i$ of an $i^{th}$ type InAlP layer can differ from those of the other p-type InAlP layers of the n-number of p-type InAlP layers, it is desirable that the respective upper limits x2 of the n number of p-type InAlP layers satisfy the following condition. That is, in the case where the p-type clad layer includes the n number of p-type InAlP layers, the absolute value of the average strain amount $\varepsilon_{av}$ of the whole p-type clad layer is equal to or less than the absolute value of the critical strain amount $\varepsilon_c$ obtained by Matthews' relational expression, or Expression (2), using the entire layer thickness of the whole p-type clad layer as a critical layer thickness $t_c$.

For example, in the case where the semiconductor laser device 100 has a multilayer structure in which a pair of a p-type InP layer and a p-type InAlP layer is grown the n number of times such that the p-type InP layer and the p-type InAlP layer are alternately grown, as illustrated in FIG. 5, the Al composition $x_i$, the strain amount $\varepsilon_i$, and the layer thickness $t_i$ of an $i^{th}$ p-type InAlP layer may differ from those of the other p-type InAlP layers of the n number of p-type InAlP layers. It is only required that the absolute value of the average strain amount $\varepsilon_{av}$ of the whole p-type clad layer is equal to or less than the absolute value of the critical strain amount $\varepsilon_c$ obtained by Matthews' relational expression, or Expression (2), using the entire layer thickness of the whole p-type clad layer as a critical layer thickness $t_c$. The upper limit x2 of the Al composition $x_i$ of each of the p-type InAlP layers can be determined such that the average strain amount $\varepsilon_{av}$ of the whole p-type clad layer can satisfy the above-mentioned condition. As a pseudomorphic state is maintained in each of the n number of p-type InAlP layers, an effect of stabilized doping concentration of the p-type dopant can be achieved while reducing the crystal defect with the p-type clad layer due to increase in strain amount and deterioration in device characteristic and reliability.

It is further desirable that the absolute value of the strain amount of at least one p-type InAlP layer of the n number of p-type InAlP layers is equal to or less than the absolute value of the critical strain amount $\varepsilon_c$ obtained by Matthews' relational expression, or Expression (2), using the layer thickness of the p-type InAlP layer as a critical layer thickness $t_c$. That is, the upper limit x2 of the Al composition x of that p-type InAlP layer is equal to the value of the Al composition x corresponding to the critical strain amount $\varepsilon_c$. As a pseudomorphic state is maintained more stably at least in that p-type InAlP layer, an effect of further stabilized doping concentration of the p-type dopant can be achieved while reducing the defect with the p-type clad layer due to increase in strain amount and deterioration in device characteristic and reliability.

It is further desirably that the absolute value of the strain amount $\varepsilon_i$ of each (an $i^{th}$ p-type InAlP layer of the p-type InAlP layers) of the n number of p-type InAlP layers is equal to or less than the absolute value of the critical strain amount $\varepsilon_c$ obtained by Matthews' relational expression, or Expression (2), using the layer thickness $t_i$ as a critical layer thickness $t_c$. That is, the upper limit x2 of the Al composition $x_i$ of each p-type InAlP layer is equal to the value of the Al composition x corresponding to the critical strain amount $\varepsilon_c$ of the p-type InAlP layer. As a pseudomorphic state is maintained in the n number of respective p-type InAlP layers, an effect of further stabilized doping concentration of the p-type dopant can be achieved while reducing the crystal defect with the p-type clad layer due to increase in strain amount and deterioration in device characteristic and reliability.

Although a case in which the p-type clad layer has a multilayer structure in which a pair of a p-type InP layer and a p-type InAlP layer is grown the n number of times such that the p-type InP layer and the p-type InAlP layer are alternately grown (see FIG. 5) has been described as an example, this is not an exclusive example. It is only required that the p-type clad layer includes the n number of p-type InAlP layers, and disposition of a p-type InP layer between all adjacent p-type InAlP layers is not indispensable. That is, any other semiconductor layer may be disposed or a p-type InP layer and other semiconductor layers may be disposed. In either case, it is only required that the absolute value of the average strain amount $\varepsilon_{av}$ of the whole p-type clad layer is equal to or less than the absolute value of the critical strain amount $\varepsilon_c$ obtained by Matthews' relational expression, or Expression (2), using the entire layer thickness of the whole p-type clad layer as a critical layer thickness $t_c$. The upper limit x2 of the Al composition x of each of the n number of respective p-type InAlP layers is obtained based on this condition. The upper limit of the absolute value of the strain amount $\varepsilon_i$ of each of the p-type InAlP layers is obtained by Expression (3), based on the upper limit x2 of the Al composition $x_i$ of that p-type InAlP layer. Using Expression (5), the upper limit of the absolute value of the average strain amount $\varepsilon_{av}$ of the whole p-type clad layer is obtained. The upper limit x2 of the Al composition $x_i$ of each of the n number of p-type InAlP layers can be determined such that the upper limit of the absolute value of the average strain amount $\varepsilon_{av}$ is equal to or less than the absolute value of the critical strain amount $\varepsilon_c$ obtained by Matthews' relational expression, or Expression (2), using the total layer thickness of the whole p-type clad layer as a critical layer thickness $t_c$. It is further desirable that the absolute value of the strain amount $\varepsilon$ of at least one p-type InAlP layer of the n number of p-type InAlP layers is equal to or less than the absolute value of the critical strain amount $\varepsilon_c$ obtained by Matthews' relational expression, or Expression (2), using the layer thickness of that p-type InAlP layer as a critical layer thickness $t_c$. It is still further desirable that the absolute value of the strain amount $\varepsilon_i$ of each (an $i^{th}$ p-type InAlP layer of the p-type InAlP layers) of the n number of p-type InAlP layers is equal to or less than the absolute value of the critical strain amount $\varepsilon_c$, obtained by Matthews' relational expression, or Expression (2), using the layer thickness $t_i$ as a critical layer thickness $t_c$.

The below describes one example of the range of the Al composition x actually used. Assume a case where the p-type clad layer has the multilayer structure illustrated in FIG. 5. Generally, the doping concentration of the p-type dopant in each of the plurality of p-type InAlP layers included in the p-type clad layer is equal to or greater than $1 \times 10^{17}$ cm$^{-3}$, and the layer thickness of the p-type clad layer is equal to or greater than 0.5 μm. Thus, the lower limit x1 and the upper limit x2 of the Al composition x in the case where the doping concentration of the p-type dopant in the p-type InAlP layer is $1 \times 10^{17}$ cm$^3$ and the layer thickness is 0.5 μm will be described. The lower limit x1 of the Al composition x is equal to a value corresponding to the atomic concentration of $1 \times 10^{17}$ cm$^{-3}$, same as the doping concentration of the p-type dopant, and specifically, is $5 \times 10^{-6}$ according to Expression (1). The absolute value of the critical strain amount $\varepsilon_c$ obtained by Expression (2) using the critical film thickness $t_c$ at 0.5 μm is 0.0014 (0.14%), and this value corresponds to the upper limit of the average strain amount $\varepsilon_{av}$. The upper limit of the average Al composition $x_{av}$ of the p-type clad layer is 0.02 (=$2 \times 10^{-2}$). This corresponds to the upper limit x2 of the Al composition x. With the above, the range of the Al composition $x_i$ of each (an $i^{th}$ p-type InAlP layer of the p-type InAlP layers) of the n number of p-type InAlP layers is $5 \times 10^{-6} <= x_i <= 0.02$.

Figure 6:
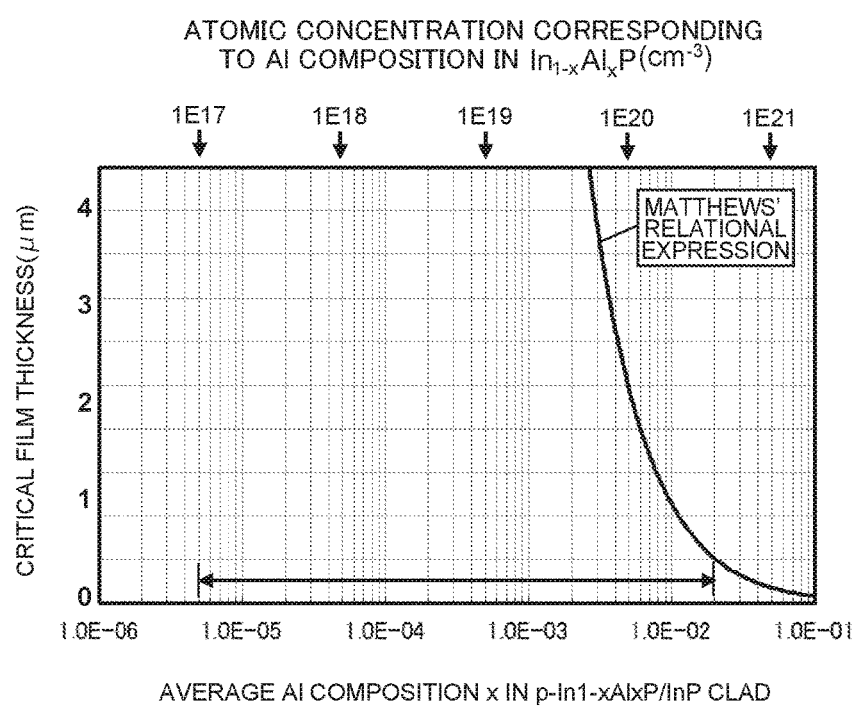
FIG. 6 indicates the range of Al composition x of a p-type InAlP layer in a p-type clad layer illustrated in FIGS. 4A and 4B.

FIG. 6 illustrates the range of the Al compositions x of the p-type InAlP layers in the p-type clad layer illustrated in FIG. 5. In the drawing, the ordinate corresponds to the entire layer thickness of the whole p-type clad layer, that is, the critical layer thickness $t_c$ in Matthews' relational expression, or Expression (2), the lower abscissa corresponds to the average Al composition $x_{av}$, and the upper abscissa corresponds to the doping concentration (atomic concentration) of the p-type dopant corresponding to the Al composition x. Actually, the entire layer thickness $t_0$, or the sum of the layer thicknesses of the n number of p-type InP layers, and the strain amount $\varepsilon_i$ and layer thickness $t_i$ of each (an $i^{th}$ p-type InAlP layer of the p-type InAlP layers) of the n number of p-type InAlP layers in Expression (5) are determined such that (the absolute value of) the average strain amount $\varepsilon_{av}$ of the p-type clad layer is 0.0014. The denominator on the right side of Expression (5) indicates the layer thickness of the whole p-type clad layer, namely, 0.5 μm.

As the semiconductor laser device is sensitive to crystal defect, it is desirable that the upper limit is set as large as about 0.7 times the upper limit x2 mentioned above to ensure allowance, depending on a device structure. In this case, the range of the Al composition x is $5 \times 10^{-6} <= x <= 0.014$. Meanwhile, since Matthews' relational expression provides the strictest critical film thickness and strain, a slight excess over the critical film thickness can be tolerable, depending on a device structure. If a strain amount as large as 1.3 times the critical strain amount is tolerable, the composition range is $5 \times 10^{-6} <= x <= 0.026$ in such a case.

It is desirable that the p-type dopant according to this embodiment is one or more atoms selected from the group consisting of Be, Mg, and Zn. These atoms make p-type dopants that are generally used with an InP layer. The present invention is optimum with respect to these p-type dopants.

JP H07-263804 A describes a semiconductor laser having a clad layer 12 made of an n-type InAlP film having a film thickness of about 2.5 μm, as illustrated in FIG. 1 of the publication, in which the clad layer 12 has a lattice constant smaller by about 0.9% than that of the n-InP substrate 11. The strain of the InAlP film constituting the clad layer 12 is about −0.9%, or a value whose absolute value is very large, as compared with the strain of the p-type clad layer of the semiconductor laser device 100 according to this embodiment.

The semiconductor layer disclosed in JP H07-263804 A aims to achieve a wider band gap to improve light-emitting efficiency by employing an InAlP film with a large Al composition x for the clad layer 12 (see FIG. 2 of JP H07-263804 A). The absolute value of the strain of the InAlP film disclosed in JP H07-263804 A is very large, as compared with the range of the absolute value of the strain of a p-type clad layer according to this embodiment. As widening a band gap requires a larger Al composition x of an InAlP film, it is assumed that lattice mismatch dislocation is inevitably caused with the clad layer 12.

The main characteristic of the prevent invention lies in that the Al composition x of p-type InAlP layer is maintained within a range at low values so that inclusion of a p-type InAlP layer in a p-type clad layer reduces variation of p-type dopant and a pseudomorphic condition that does not cause lattice mismatch dislocation can be maintained. This characteristic is ensured for the purpose of achieving a device structure having high quality with less generation of lattice mismatch dislocation to improve the device characteristic in view of the recent trend of requiring higher performance of optical semiconductor devices (in particular, semiconductor laser devices).

The Al composition x of the p-type InAlP layer included in the p-type clad layer according to this embodiment is limited to the optimum range with a pseudomorphic state maintained. In this embodiment, the band gap of the p-type InAlP layer increases by as small as about 40 mV, which is very small as compared with the energy available at a room temperature. That is, the band gap is rarely widened.

Second Embodiment

An EA modulator integrated semiconductor laser device 200 according to the second embodiment of the present invention is an optical semiconductor device including a laser unit 200A, a modulator unit 200B, and a light waveguide portion 200C, all being monolithically integrated on a semiconductor substrate, in which the laser unit 200A is a Distributed Feedback (DFB) semiconductor laser device, and the modulator unit 200B is an EA modulator. The EA modulator integrated semiconductor laser device 200 according to this embodiment has a buried-hetero structure.

Figure 7:
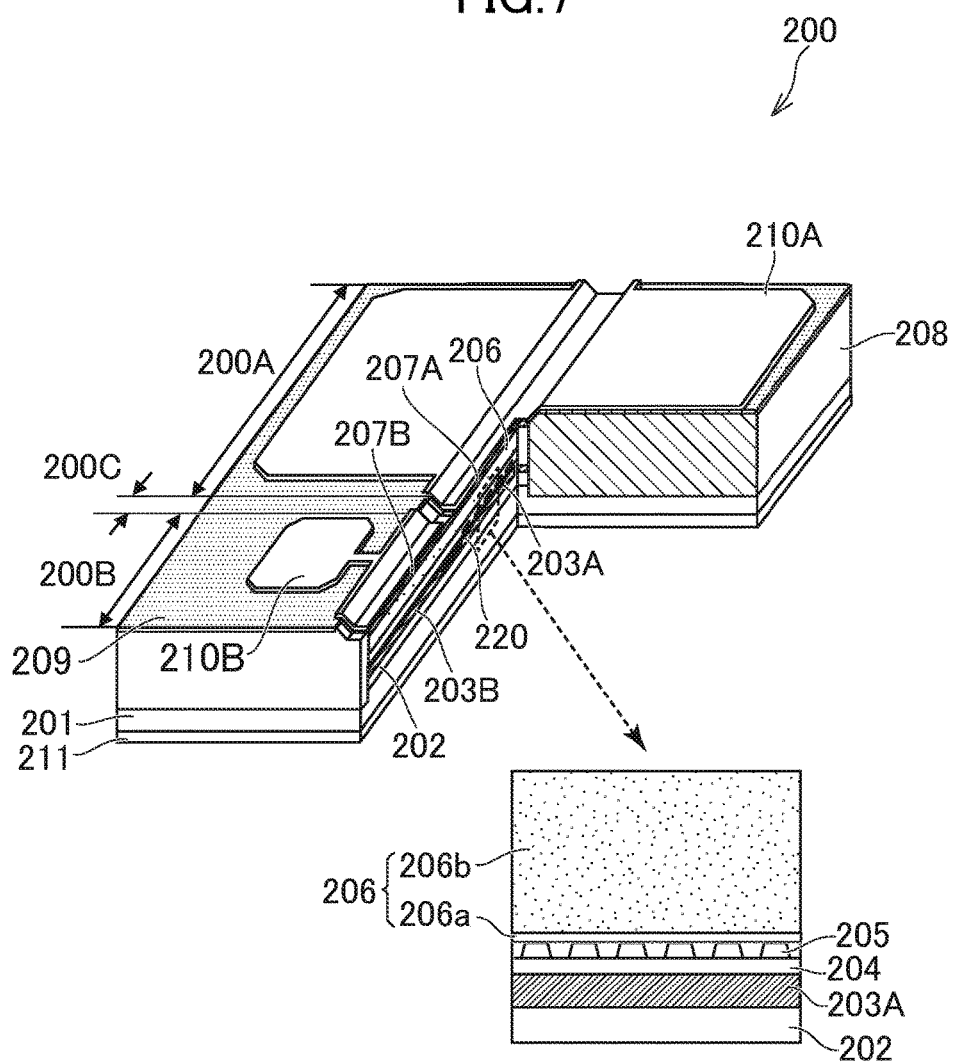
FIG. 7 is a bird's eye view of an EA modulator integrated semiconductor laser device according to a second embodiment of the present invention.

FIG. 7 is a bird-eye's view of the EA modulator integrated semiconductor laser device 200 according to this embodiment. The main characteristic of the EA modulator integrated semiconductor laser device 200 according to this embodiment lies in the structure of the p-type clad layer, similar to the first embodiment, in which the p-type clad layer includes one pair of a p-type InP layer and a p-type InAlP layer.

In the laser unit 200A, first multiple semiconductor layers including an n-type InP buffer layer 202, a first MQW layer 203A, a p-type InP spacer layer 204, a grating layer 205, a p-type InP clad layer 206a, a p-type InAlP clad layer 206b, and a first p$^+$-type InGaAs contact layer 207A are disposed on an n-type InP substrate 201. Here, the first MQW layer 203A consists of well layers and barrier layers both made of InGaAsP which are repeated at the plurality of times. The layer thickness of the p-type InP clad layer 206a is 50 nm, and that of the p-type InAlP clad layer 206b is 950 nm. The p-type clad layer 206 in the laser unit 200A according to this embodiment includes the p-type InP clad layer 206a and the p-type InAlP clad layer 206b. The entire layer thickness of the whole p-type clad layer 206 is 1 μm. The Al composition x of the p-type InAlP clad layer 206b is 0.003, and the strain amount thereof is −0.0002 (−0.02%). The strain amount of the whole p-type clad layer is −0.00019 (−0.019%).

In the modulator unit 200B, second multiple semiconductor layers including the n-type InP buffer layer 202, a second MQW layer 203B, the p-type InP clad layer 206a, the p-type InAlP clad layer 206b, and a second p$^+$-type InGaAs contact layer 207B are disposed on the n-type InP substrate 201. Here, the second MQW layer 203B consists of wall layers and barrier layers both made of InGaAsP which are repeated at plurality of times. The p-type clad layer 206 in the modulator unit 200B according to this embodiment includes the p-type InP clad layer 206a and the p-type InAlP clad layer 206b. The p-type clad layer is disposed directly on the second MQW layer 203B, or an active layer. The layer thickness of the p-type InP clad layer 206a is 50 nm, that of the p-type InAlP clad layer 206b is 950 nm, and the entire layer thickness of the whole p-type clad layer 206 is 1 μm.

In the light waveguide portion 200C, third multiple semiconductor layers including the n-type InP buffer layer 202, a light waveguide layer 220 made of InGaAsP, the p-type InP clad layer 206a, and the p-type InAlP clad layer 206b are fabricated.

It is desirable that the entire layer thickness of the whole p-type clad layer 206 is equal to or greater than 0.5 μm and equal to or less than 2 μm both in the laser unit 200A and in the modulator unit 200B, respectively. It is further desirable that the entire layer thickness of the whole p-type clad layer 206 is equal to or greater than 1 μm.

The first multiple semiconductor layers, the third multiple semiconductor layers, and the second multiple semiconductor layers are sequentially connected to thereby constitute one set of multiple semiconductor layers that have a mesa structure as a whole. On the respective both sides of the multiple semiconductor layers having a mesa structure, an Ru-doped InP buried layer 208 is buried. A passivation film 209 is disposed on the upper surface of the multiple semiconductor layers and the Ru-doped InP buried layer 208 except (at least a part of) the upper surface of the first p$^+$-type InGaAs contact layer 207A and (at least a part of) the second p$^+$-type InGaAs contact layer 207B. A first upper electrode 210A is disposed physically in contact with (at least a part of) the upper surface of the first p$^+$-type InGaAs contact layer 207A and extending sideways on the respective both sides of the first multiple semiconductor layers. Similarly, a second upper electrode 210B physically in contact with (at least a part of) the upper surface of the second p$^+$-type InGaAs contact layer 207B and having a pad portion extending sideways on one side of the second multiple semiconductor layers is disposed. Further, a lower electrode 211 is disposed physically in contact with the rear surface of the n-type InP substrate 201.

The following describes a method for manufacturing the EA modulator integrated semiconductor laser device 200 according to this embodiment. Similar to the first embodiment, MOVPE is used as a crystal growth, which, however, is not an exclusive example. Materials common to those in the first embodiment are used here. The material of a halogen atom for doping in the Ru-doped InP buried layer 208 is methyl chloride (CH$_3$Cl) here. The organic metal material of Ru for doping is bisethylcyclopentadienyl ruthenium here.

Firstly, an n-type InP buffer layer 202 is crystal grown on the n-type InP substrate 201 by MOVPE, followed by crystal growth of the second MQW layer 203B and a p-type InP cap layer. Secondly, a mask pattern is formed on a wafer in an area for formation of the modulator unit 200B, followed by removal of the p-type InP cap layer and the second MQW layer 203B, using the mask pattern as an etching mask. Thirdly, the wafer is introduced into a growing furnace, where the first MQW layer 203A, the p-type InP spacer layer 204, a semiconductor layer for formation of a grating, and a p-type InP cap layer are crystal re-grown by means of butt-joint (BJ). Fourthly, the mask pattern is removed. Then, another mask pattern is formed on the wafer in an area for formation of the laser unit 200A and the modulator unit 200B, and the semiconductor layer between the p-type InP cap layer and the first MQW layer 203A is removed using the mask pattern as an etching mask. Fifthly, the light waveguide layer 220 and the p-type InP cap layer are crystal re-grown through BJ. In the above, crystal re-growing is achieved through BJ simultaneously at two positions for connection with the laser unit 200A and the modulator unit 200B, respectively. Sixthly, the wafer is taken out of the growing furnace, the mask pattern is removed, and a grating is formed through known processing. Seventhly, the wafer is placed inside the growing furnace, p-type InP is buried in the grating to thereby form the grating layer 205, and the p-type InP clad layer 206a, the p-type InAlP clad layer 206b, and a p+-type InGaAs contact layer are sequentially crystal grown on the grating layer 205. Eighthly, a mesa stripe mask is formed on the multiple semiconductor layers in an area for formation of a light waveguide in a plan view, and a mesa structure is formed through etching. The masa stripe mask is not formed in an area on the second multiple semiconductor layers within a predetermined distance from the emitting end face, as having been removed through etching.

Ninthly, appropriate pre-processing is executed to bury the Ru-doped InP buried layer 208 in the areas on the respective both sides of the multiple semiconductor layers having a mesa structure. In the above, when the Ru-doped InP layer 208 is grown, $CH_3Cl$ gas is simultaneously supplied. In the area within a predetermined distance from the emitting end face, the Ru-doped InP buried layer 208 is buried, whereby a so-called window structure is formed. This structure aims to reduce the light reflected at the mesa edge. Tenthly, of the p+-type InGaAs contact layer, or the top layer of the multiple semiconductor layers, a portion in the light waveguide portion 200C is removed to thereby separate the p+-type InGaAs contact layer into the first p+-type InGaAs contact layer 207A and the second p+-type InGaAs contact layer 207B. Eleventhly, the passivation film 209 is formed on the upper surface of the multiple semiconductor layers and the Ru-doped InP buried layer 208 except (at least a part of) the upper surface of the first p+-type InGaAs contact layer 207A and (at least a part) of the upper surface of the second p+-type InGaAs contact layer 207B. Twelfthly, the first upper electrode 210A is formed so as to be physically in contact with (at least a part of) the upper surface of the first p+-type InGaAs contact layer 207A, the second upper electrode 210B is formed so as to be physically in contact with (at least apart of) the upper surface of the second p+-type InGaAs contact layer 207B, and the lower electrode 211 is formed so as to be physically in contact with the rear surface of the n-type InP substrate 201. With the above, the wafer manufacturing step ends. Subsequent steps are similar to those in the first embodiment. The above has described the method for manufacturing the EA modulator integrated semiconductor laser device 200 according to this embodiment.

In the manufacturing method, a p-type InP is disposed on a portion in contact with the grating whereby the grating layer 205 is formed and the p-type InP clad layer 206a is also formed. Formation of the p-type InAlP clad layer 206b on the p-type InP clad layer 206a enables formation of a p-type clad layer having high quality. Similar to the first embodiment, the material utilizing efficiency in manufacturing increases, and variation in atomic concentration of p-type dopant significantly decreases even when semiconductor multilayers are formed through a plurality of times of crystal growth, using the same manufacturing tool. As a result, the manufacturing yield of the EA modulator integrated semiconductor laser device 200 improves. Although InGaAsP-based material is used for the first MQW layer 203A and the second MQW layer 203B in this embodiment, this is not an exclusive example, and InGaAlAs-based material may be used, and such material doped with Sb or/and N may be used.

Third Embodiment

Figure 8:
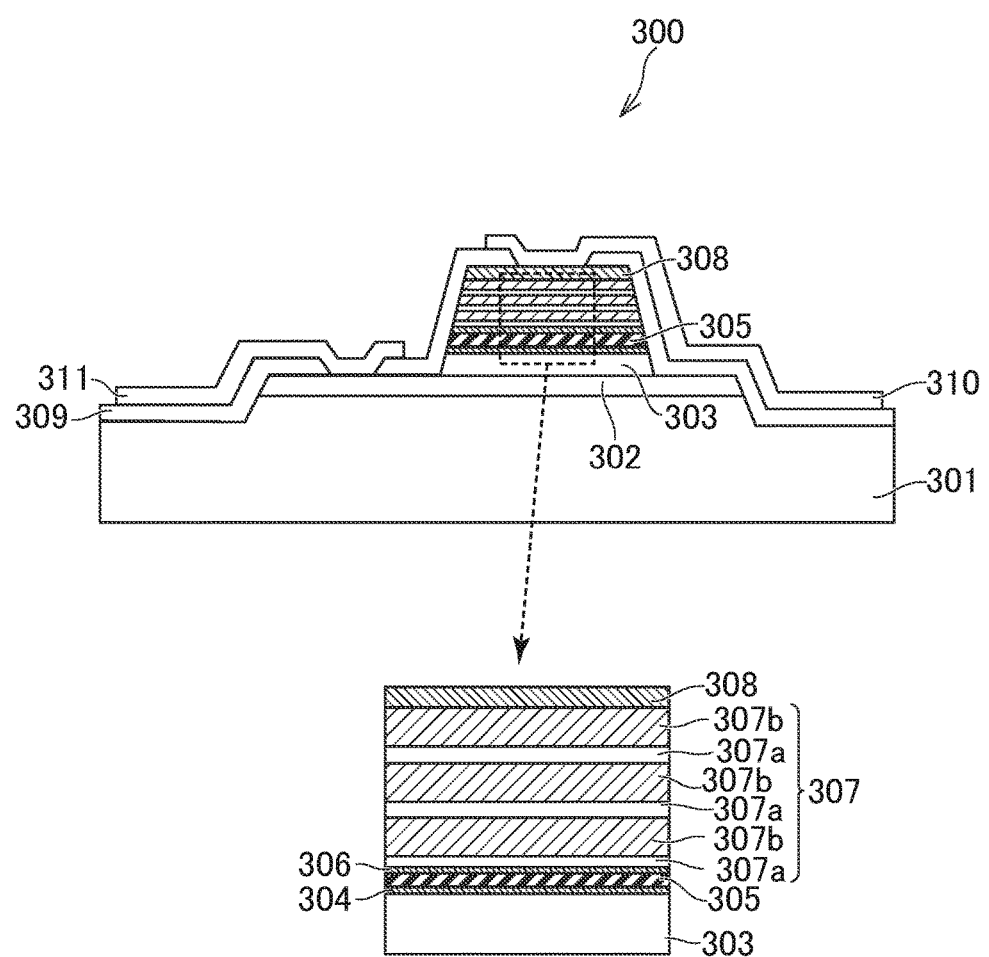
FIG. 8 is a cross sectional view of a PIN-type diode according to a third embodiment of the present invention.

FIG. 8 is a cross sectional view of a PIN-type diode 300 according to a third embodiment of the present invention. A PIN-type diode according to this embodiment is an optical semiconductor device that is a semiconductor light-receiving element, whereas the optical semiconductor devices according to the first and second embodiments are semiconductor light-emitting elements. The main characteristic of the PIN-type diode 300 according to this embodiment lies in the structure of the p-type clad layer, similar to the first and second embodiment, in which the p-type clad layer includes three pairs of p-type InP layers and p-type InAlP layers.

Semiconductor multilayers including an n-type InGaAs contact layer 302, an n-type InP clad layer 303, an n-type InGaAsP SCH layer 304, an intrinsic InGaAs light absorbing layer 305, a p-type InGaAsP light absorbing layer 306, a p-type clad layer 307, and a p+-type InGaAs contact layer 308 are formed on a semi-insulating InP substrate 301. In the above, the n-type InGaAs contact layer 302 and the n-type InP clad layer 303 are disposed under the active layer, whereby an n-type semiconductor layer is formed. The n-type InGaAsP SCH layer 304, the intrinsic InGaAs light absorbing layer 305, and the p-type InGaAsP light absorbing layer 306 constitute an active layer. Further, the p-type clad layer 307 is disposed on the active layer, whereby a p-type clad layer is formed. The p-type clad layer 307 has a multilayer structure in which a p-type InP clad layer 307a and a p-type InAlP clad layer 307b are repetitively grown at three times (n=3) in the growth direction, that is, from bottom to up. The layer thicknesses of each of the three p-type InP clad layers 307a is 100 nm, and that of each of the three p-type InAlP clad layers 307b is 400 nm. The Al composition x of each of the three p-type InAlP clad layers 307b is 0.004, and the strain amount is −0.028%. As a whole of the p-type clad layer 307, the absolute value of the average strain amount is decreased to −0.022%. The entire layer thickness of the whole p-type clad layer 307 is 1.5 µm.

It is desirable that the entire layer thickness of the p-type clad layer 307 is equal to or greater than 0.5 µm and equal to or less than 2 µm. Alternatively, the entire layer thickness of the p-type clad layer 307 may be less than 0.5 µm, specifically, equal to or greater than 0.3 µm or equal to or less than (less than) 0.5 µm.

The multiple semiconductor layers have a conical trapezoid shape. The n-type InGaAs contact layer 302 is disposed extending from the conical trapezoid shape. The passivation film 309 is disposed covering the semiconductor multilayers except (at least a part of) the upper surface of the p+-type InGaAs contact layer 308 and a part of the upper surface of the n-type InGaAs contact layer 302. A p-side electrode 310 is formed physically in contact with (at least a part of) the upper surface of the p+-type InGaAs contact layer 308 and extending outward from the conical trapezoid shape. An n-side electrode 311 is formed physically in contact with a part of the upper surface of the n-type InGaAs contact layer 302 and extending outward from the conical trapezoid shape.

The following describes a method for manufacturing the PIN-type diode 300 according to this embodiment. Similar to the first and second embodiments, MOVPE is used as a crystal growth, which, however, is not an exclusive example.

Firstly, the n-type InGaAs contact layer 302, the n-type InP clad layer 303, the n-type InGaAsP SCH layer 304, the intrinsic InGaAs light absorbing layer 305, and the p-type InGaAsP light absorbing layer 306 are sequentially grown on the semi-insulating InP substrate 301. Secondly, the p-type InP clad layer 307a having a layer thickness of 100 nm and the p-type InAlP clad layer 307b having a layer thickness of 400 nm are sequentially and repetitively grown three times to thereby form the p-type clad layer 307. With the above, a multilayer structure including three pairs of the p-type InP clad layers 307a and the p-type InAlP clad layers 307b is constituted. Thirdly, the p⁺-type InGaAs contact layer 308 is grown. With the above, crystal growth step of the semiconductor multilayers ends.

Fourthly, an outer portion of the semiconductor multilayers is removed to thereby shape the semiconductor multilayers into a conical trapezoid shape. Fifthly, the passivation film 309 is formed over the entire surface of the multiple semiconductor layers of the semi-insulating InP substrate 301, followed by formation of a through-hole in an area constituting (at least a part of) the upper surface of the p⁺-type InGaAs contact layer 308 in a plan view and in an area constituting a part of the upper surface of the n-type InGaAs contact layer 302. Fifthly, the p-side electrode 310 is formed in a predetermined shape so as to be physically in contact with (at least apart of) the upper surface the p⁺-type InGaAs contact layer 308 through the through-hole, and the n-side electrode 311 is formed in a predetermined shape so as to be physically in contact with a part of the upper surface of the n-type InGaAs contact layer 302 through the through-hole. With the above, the wafer manufacturing step ends with the PIN-type diode 300 formed as a separate device. The above has described the method for manufacturing the PIN-type diode 300 according to this embodiment.

According to the manufacturing method, the multilayer structure of the p-type clad layer 307 including three pairs of the p-type InP clad layers 307a and the p-type InAlP clad layers 307b enables formation of the p-type clad layer 307 having high quality. Similar to the first and second embodiments, the material utilizing efficiency in manufacturing increases, and variation in atomic concentration of p-type dopant significantly decreases even when the multiple semiconductor layers are formed through a plurality of times of crystal growth, using the same manufacturing device. As a result, the manufacturing yield of the PIN-type diode 300 improves.

The above has described the optical semiconductor device, the optical subassembly, and the optical module according to the embodiments of the present invention. Although the first conductivity type is an n-type and the second conductivity type is an p-type in the above embodiments, the conductivity types can be opposite. That is, for example, in a semiconductor laser device, the n-type clad layer disposed on the p-type InP substrate may include one or more n-type $In_{1-x}Al_xP$ layers, and the n-type dopant may be Si.

Although the optical semiconductor devices according to the first and second respective embodiments are semiconductor laser devices, this is not an exclusive example, and the optical semiconductor devices may be any other semiconductor light-emitting elements, such as LEDs. Although the optical semiconductor device according to the second embodiment includes an EA modulator, this is not an exclusive example, and the optical semiconductor device may include any other semiconductor modulator. Although the optical semiconductor device according to the third embodiment is a PIN-type diode, the optical semiconductor device may be other types of photodiode or any other semiconductor light-receiving elements, such as an avalanche diode.

In the semiconductor light-emitting element according to the above-mentioned embodiments, similar to the third embodiment, multiple semiconductor layers may be grown on a semi-insulating InP substrate, and an n-side electrode for connection to an n-type semiconductor layer and a p-side electrode for connection to a p-type semiconductor layer may be both disposed on one side of the semi-insulating substrate. Meanwhile, in the semiconductor light-receiving element according to the above-mentioned embodiments, similar to the first and second embodiments, multiple semiconductor layers may be grown on an n-type (p-type) InP substrate, and a p-type (n-type) clad layer may be disposed on the active layer. The present invention is widely applied to semiconductor light-emitting elements, semiconductor light-receiving elements, or semiconductor modulators.

While there have been described what are at present considered to be certain embodiments of the invention, it will be understood that various modifications may be made thereto, and it is intended that the appended claims cover all such modifications as fall within the true spirit and scope of the invention.

What is claimed is:

1. An optical semiconductor device, comprising:
   an InP substrate;
   an active layer disposed above the InP substrate;
   a semiconductor layer of a first conductivity type disposed below the active layer; and
   a clad layer of a second conductivity type disposed above the active layer, wherein
   the clad layer of the second conductivity type includes one or more $In_{1-x}Al_xP$ layers of the second conductivity type,
   an Al composition x of each of the one or more $In_{1-x}Al_xP$ layers of the second conductivity type is equal to or greater than a value corresponding to a doping concentration of a dopant of the second conductivity type, and
   an absolute value of an average strain amount of a whole of the clad layer of the second conductivity type is equal to or less than an absolute value of a critical strain amount obtained by Matthews' relational expression, using an entire layer thickness of the whole of the clad layer of the second conductivity type as a critical layer thickness.

2. The optical semiconductor device according to claim 1, wherein
   the clad layer of the second conductivity type includes one $In_{1-x}Al_xP$ layer of the second conductivity type,
   an Al composition x of the one $In_{1-x}Al_xP$ layer of the second conductivity type is equal to or greater than a value corresponding to a doping concentration of the dopant of the second conductivity type in the one $In_{1-x}Al_xP$ layer of the second conductivity type, and
   an absolute value of a strain amount of the one $In_{1-x}Al_xP$ layer of the second conductivity type is equal to or less than an absolute value of a critical strain amount obtained by the Matthews' relational expression, using a layer thickness of the one $In_{1-x}Al_xP$ layer of the second conductivity type as the critical layer thickness.

3. The optical semiconductor device according to claim 1, wherein
   the clad layer of the second conductivity type includes one InP layer of the second conductivity type and one $In_{1-x}Al_xP$ layer of the second conductivity type,
   an Al composition x of the one $In_{1-x}Al_xP$ layer of the second conductivity type is equal to or greater than a value corresponding to a doping concentration of the dopant of the second conductivity type in the one $In_{1-x}Al_xP$ layer of the second conductivity type, and
   an absolute value of a strain amount of the one $In_{1-x}Al_xP$ layer of the second conductivity type is equal to or less than an absolute value of a strain amount of the one $In_{1-x}Al_xP$ layer of the second conductivity type, the strain amount being obtained based on an average strain amount of the whole of the clad layer of the second conductivity type, the average strain amount being a critical strain amount obtained by Matthews' relational expression, using the entire layer thickness of the whole of the clad layer of the second conductivity type as the critical layer thickness.

4. The optical semiconductor device according to claim 1, wherein the clad layer of the second conductivity type includes an n (n being an integer equal to or greater than two) number of the $In_{1-x}Al_xP$ layers of the second conductivity type and an (n−1) number of InP layers of the second conductivity type each being disposed between adjacent $In_{1-x}Al_xP$ layers of the second conductivity type of the n number of the $In_{1-x}Al_xP$ layers.

5. The optical semiconductor device according to claim 1, wherein
the optical semiconductor device is a semiconductor light-emitting element,
the InP substrate is an InP substrate of the first conductivity type, and
the layer thickness of the whole of the clad layer of the second conductivity type is equal to or greater than 0.5 μm and equal to or less than 2 μm.

6. The optical semiconductor device according to claim 5, further comprising a grating layer disposed between the active layer and the clad layer of the second conductivity type.

7. The optical semiconductor device according to claim 1, wherein
the optical semiconductor device is a semiconductor optical modulator,
the InP substrate is an InP substrate of the first conductivity type, and
the layer thickness of the whole of the clad layer of the second conductivity type is equal to or greater than 0.5 μm and equal to or less than 2 μm.

8. The optical semiconductor device according to claim 1, wherein
the optical semiconductor device is a semiconductor light-receiving element,
the InP substrate is a semi-insulating InP substrate, and
the layer thickness of the whole of the clad layer of the second conductivity type is equal to or greater than 0.5 μm and equal to or less than 2 μm.

9. The optical semiconductor device according to claim 1, wherein
the first conductivity type is an n-type,
the second conductivity type is a p-type, and
the dopant of the second conductivity type is one or more atoms selected from a group consisting of Zn, Mg, and Be.

10. An optical subassembly comprising the optical semiconductor device according to claim 1.

11. An optical module comprising the optical subassembly according to claim 10.

* * * * *